(12) United States Patent
Kihara et al.

(10) Patent No.: US 10,763,123 B2
(45) Date of Patent: Sep. 1, 2020

(54) METHOD FOR PROCESSING WORKPIECE

(71) Applicant: TOKYO ELECTRON LIMITED, Tokyo (JP)

(72) Inventors: Yoshihide Kihara, Miyagi (JP); Toru Hisamatsu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 46 days.

(21) Appl. No.: 16/089,071

(22) PCT Filed: Mar. 27, 2017

(86) PCT No.: PCT/JP2017/012399
§ 371 (c)(1),
(2) Date: Sep. 27, 2018

(87) PCT Pub. No.: WO2017/170405
PCT Pub. Date: Oct. 5, 2017

(65) Prior Publication Data
US 2019/0131141 A1 May 2, 2019

(30) Foreign Application Priority Data

Mar. 29, 2016 (JP) .................. 2016-065802
Jul. 27, 2016 (JP) .................. 2016-147475

(51) Int. Cl.
*H01L 21/311* (2006.01)
*H01L 21/02* (2006.01)
(Continued)

(52) U.S. Cl.
CPC .... *H01L 21/31144* (2013.01); *H01L 21/0228* (2013.01); *H01L 21/0273* (2013.01);
(Continued)

(58) Field of Classification Search
CPC ......... H01L 21/02164; H01L 21/02219; H01L 21/02274; H01L 21/0228; H01L 21/0273;
(Continued)

(56) References Cited

U.S. PATENT DOCUMENTS

2011/0104901 A1 5/2011 Yatsuda et al.
2016/0099148 A1* 4/2016 Kihara .................. C23C 16/402
438/695

FOREIGN PATENT DOCUMENTS

JP 2003-507880 2/2003
JP 2008-060566 A 3/2008
(Continued)

OTHER PUBLICATIONS

Papalia et al., Applications for Surface Engineering using Atomic Layer Etching, Solid State Phenomena ISSN: 1662-9779, vol. 255, pp. 41-48, (Year: 2016).*

(Continued)

*Primary Examiner* — Brook Kebede
(74) *Attorney, Agent, or Firm* — Studebaker & Brackett PC

(57) ABSTRACT

In an embodiment, a wafer W includes a layer EL to be etched and a mask MK4 provided on the layer EL to be etched, and a method MT of an embodiment, the layer EL to be etched is etched by removing the layer EL to be etched for each atomic layer, by repeating sequence SQ3 including step ST9a of irradiating the mask MK4 with secondary electrons by generating plasma and applying a DC voltage to an upper electrode 30 of a parallel plate electrode, and covering the mask MK4 with silicon oxide compound, step ST9b of generating plasma of fluorocarbon-based gas and forming a mixed layer MX2 including radicals on an atomic (Continued)

layer of the layer EL to be etched, and ST9d of generating plasma of Ar gas and applying a bias voltage to remove the mixed layer MX2.

20 Claims, 6 Drawing Sheets

(51) Int. Cl.
H01L 21/3105 (2006.01)
H01L 21/3213 (2006.01)
H01L 21/027 (2006.01)

(52) U.S. Cl.
CPC .. H01L 21/02164 (2013.01); H01L 21/02219 (2013.01); H01L 21/02274 (2013.01); H01L 21/3105 (2013.01); H01L 21/31058 (2013.01); H01L 21/31116 (2013.01); H01L 21/31138 (2013.01); H01L 21/32139 (2013.01)

(58) Field of Classification Search
CPC ........... H01L 21/3105; H01L 21/31058; H01L 21/31116; H01L 21/31138; H01L 21/31144; H01L 21/32139; H01L 21/67069; H01L 21/67109; H01L 21/6831
USPC ........................................................ 438/702
See application file for complete search history.

(56) References Cited

FOREIGN PATENT DOCUMENTS

| | | |
|---|---|---|
| JP | 2012-015343 A | 1/2012 |
| JP | 2012-028603 A | 2/2012 |
| JP | 2013-178574 A | 9/2013 |
| JP | 2014-075567 A | 4/2014 |
| JP | 2014-532988 | 12/2014 |
| JP | 2015-026849 A | 2/2015 |
| TW | 2006-29337 A | 8/2006 |
| TW | 2013-24613 A1 | 6/2013 |
| TW | 2014-26856 A | 7/2014 |
| WO | 01/12873 A1 | 2/2001 |
| WO | 2004/034445 A2 | 4/2004 |
| WO | 2013/062831 A2 | 5/2013 |

OTHER PUBLICATIONS

International Search Report issued in PCT/JP2017/012399; dated Apr. 25, 2017.

* cited by examiner (a)

(b)

(c)

METHOD FOR PROCESSING WORKPIECE

TECHNICAL FIELD

Embodiments of the present invention relate to a method for processing a workpiece, and more particularly to a method including generation of a mask.

BACKGROUND ART

In order to realize miniaturization of devices such as semiconductor devices, it is necessary to form patterns having dimensions smaller than the critical dimensions obtained by microfabrication using an existing photolithography technique. An extreme ultraviolet (EUV) technology which is a next-generation exposure technique or the like has been developed as a method for forming the patterns with such dimensions. In the EUV technique, light having a significantly shorter wavelength than the UV light source wavelength in the related art is used, for example, light having a very short wavelength of 13.5 [nm] is used. In addition, as a technique substituting the existing lithography technique, a directed self-assembly (DSA) technique for forming a pattern by using a self-assembled block copolymer (BCP) which is one of self-assembled materials that spontaneously organizes an order pattern has attracted attention.

In a case where narrow pattern etching is performed using the above EUV technique and DSA technique, the mask becomes fragile due to the narrow pattern, and collapse of the mask may occur. In contrast, a technique for protecting a mask is disclosed in Patent Literatures 1 and 2.

A plasma etching performance enhancing method disclosed in Patent Literature 1 is to form a characteristic portion by etching without bowing in a dielectric layer on a semiconductor wafer, by etching a structure defined by an etch mask using plasma. In the technique of Patent Literature 1, a mask is formed on a dielectric layer, protective silicon-containing coating is formed on the exposed surface of the mask, and the characteristic portion is formed through the mask and the protective silicon-containing coating. Further, in another method, the characteristic portion is partially etched prior to forming the protective silicon-containing coating. Thus, in the technique of Patent Literature 1, a method is proposed in which the protective silicon-containing coating is formed on the resist mask or on the side wall of the partially etched characteristic portion by using plasma, the mask is protected by the protective silicon-containing coating formed in this way, the critical dimensions (CD) is shrink controlled, and bowing is controlled by etching.

An object of a plasma etching method disclosed in Patent Literature 2 is to prevent and suppress line wiggling and striation caused by the collapse of a pattern or the like after plasma etching of a silicon oxide film or the like using a multilayer resist mask. In the technique of Patent Literature 2, in the plasma etching method for plasma-etching a film to be etched by using a multilayer resist mask, the multilayer resist mask includes an upper layer resist and a lower layer resist, and the method includes a side wall protective film forming step of forming a side wall protective film on the side wall of the lower layer resist. Thus, in the technique of Patent Literature 2, in order to prevent line wiggling and striation, it has been proposed to form a side wall protective film on the mask of a three-layer structure after processing of the lower layer resist and to prevent line wiggling and striation during etching after the formation.

CITATION LIST

Patent Literature

[Patent Literature 1] Japanese Unexamined Patent Publication No. 2008-60566
[Patent Literature 2] Japanese Unexamined Patent Publication No. 2012-15343

SUMMARY OF INVENTION

Technical Problem

However, in the technique for forming a protective film on a mask as in Patent Literatures 1 and 2, in particular, in a case where a polymerization film of carbon and fluorine is formed on a mask by CxFx-based gas used for etching of an inorganic film system, ions may impinge on the polymerization film to cause wiggling on the mask. Due to such wiggling of the mask, precise pattern etching may be hindered, and breakage of the mask or the like may also be induced. On the other hand, in the case of reducing the deposition of the polymerization film, protection against the mask becomes insufficient, which may result in a situation such as a reduction in the mask selection ratio. As described above, a technique for avoiding wiggling of the mask caused by a protective film for protecting the mask while protecting the mask needs to be realized.

Solution to Problem

In an aspect, there is provided a method for processing a workpiece. The workpiece includes a layer to be etched and a first mask provided on the layer to be etched, and in the method, the layer to be etched is etched by removing the layer to be etched for each atomic layer, by repeating a first sequence including a first step of irradiating the first mask with secondary electrons, and covering the first mask with silicon oxide compound containing silicon by releasing silicon from an electrode plate provided in an upper electrode and containing silicon, by generating plasma in a processing container of a plasma processing apparatus in which the workpiece is accommodated and applying a negative DC voltage to the upper electrode of a parallel plate electrode provided in the processing container; a second step of generating plasma of a first gas in the processing container and forming a mixed layer including radicals contained in the plasma on an atomic layer of a surface of the layer to be etched, after execution of the first step; a third step of purging a space inside the processing container, after execution of the second step; a fourth step of generating plasma of a second gas in the processing container and applying a bias voltage to the plasma to remove the mixed layer, after execution of the third step; and a fifth step of purging a space inside the processing container, after execution of the fourth step.

In this way, protection required for the first mask is performed every time the first sequence for removing the atomic layer of the surface of the layer to be etched is executed, and by repeating the first sequence, excessive protection can be avoided while protection required for etching the layer to be etched is formed on the first mask. Accordingly, since the film thickness of the protective film protecting the mask is sufficiently reduced, wiggling of the mask caused by the protective film can be avoided.

The first gas includes fluorocarbon-based gas and rare gas. In this way, since the first gas includes fluorocarbon-based gas, in a second step, fluorine radicals and carbon radicals are supplied to the surface of the layer to be etched, and a mixed layer containing both radicals can be formed in the surface.

The second gas includes rare gas. In this way, since the second gas includes rare gas, in a fourth step, the mixed layer formed in the surface of the layer to be etched can be removed from the surface, by energy received by plasma of the rare gas by a bias voltage.

A step of forming the first mask, before execution of the first sequence is further included, and the step includes a sixth step and a seventh step, and in the sixth step and the seventh step, the first mask is formed by etching an organic film provided on the layer to be etched and an antireflection film provided on the organic film by using a second mask provided on the antireflection film, in the sixth step, the antireflection film is etched, in the seventh step, the organic film is etched, after execution of the sixth step, and the first mask is formed by execution of the sixth step and the seventh step, and is formed of the antireflection film and the organic film.

The sixth step includes a step (referred to as step a) of conformally forming a protective film on the surface of the second mask in the processing container, and a step (referred to as step b) of etching the antireflection film by removing the antireflection film for each atomic layer with plasma generated in the processing container, using the second mask on which the protective film is formed, after execution of the step a. In this way, by executing the step a, a protective film having a conformal film thickness, which is precisely controlled, is formed on the second mask regardless of the density difference of the mask, resistance to etching of a mask is enhanced while the shape of the mask is maintained, and by executing the step b, the mask selection ratio is enhanced, and an influence on the mask shape (line width roughness (LWR) and line edge roughness (LER)) by etching is reduced.

The sixth step further includes a step (referred to as step c) of irradiating the second mask with secondary electrons by generating plasma in the processing container and applying a negative DC voltage to the upper electrode provided in the processing container, before execution of the step a. In this way, since the second mask is irradiated with the secondary electrons before executing step a, the second mask can be modified before the formation of the protective film, and the damage of the second mask in the subsequent steps can be suppressed.

In step c, by generating plasma in the processing container to apply a negative DC voltage to the upper electrode, silicon is released from the electrode plate and the second mask is covered with the silicon oxide compound containing silicon. In this way, in step c, the second mask is covered with the silicon oxide compound, so that the damage of the second mask in the subsequent steps can be further suppressed.

In step a, a protective film is conformally formed on the surface of the second mask, by repeating a second sequence including an eighth step of supplying a third gas into the processing container, a ninth step of purging the space inside the processing container after execution of the eighth step, a tenth step of generating plasma of a fourth gas in the processing container after execution of the ninth step, and an eleventh step of purging the space inside the processing container after execution of the tenth step, and in the eighth step, plasma of the third gas is not generated. In this way, in step a, a protective film can be conformally formed on the surface of the second mask by the same method as an atomic layer deposition (ALD) method.

The third gas includes an organic-containing aminosilane-based gas. In this way, since the third gas includes the organic-containing aminosilane-based gas, in the eighth step, a silicon reaction precursor is formed on the second mask along the atomic layer of the second mask.

In one embodiment, the aminosilane-based gas of the third gas may include aminosilane having one to three silicon atoms. The aminosilane-based gas of the third gas may include aminosilane with one to three amino groups. In this way, aminosilane containing one to three silicon atoms can be used for aminosilane-based gas of the third gas. Further, aminosilane containing one to three amino groups can be used for aminosilane-based gas of the third gas.

The fourth gas includes gas containing oxygen atoms and carbon atoms. In this way, since the fourth gas includes oxygen atoms, in the tenth step, the oxygen atom bonds with the silicon reaction precursor provided on the second mask, so that the protective film of silicon oxide can be formed conformally on the second mask. Further, since the fourth gas includes carbon atoms, erosion by oxygen atoms against the second mask can be suppressed by the carbon atoms.

After execution of the step a, in step b, the antireflection film is etched by removing the antireflection film for each atomic layer, by repeating a third sequence including a twelfth step of generating plasma of a fifth gas in the processing container and forming a mixed layer containing radicals contained in the plasma in a surface of the antireflection film, a thirteenth step of purging the space inside the processing container, after execution of the twelfth step, a fourteenth step of generating plasma of a sixth gas in the processing container and applying a bias voltage to the plasma to remove the mixed layer, after execution of the thirteenth step, and a fifteenth step of purging the space inside the processing container, after execution of the fourteenth step. In this way, in step b, it is possible to remove the antireflection film for each atomic layer by the same method as an atomic layer etching (ALE) method.

The fifth gas includes fluorocarbon-based gas and rare gas. In this way, since the fifth gas includes fluorocarbon-based gas, in the twelfth step, fluorine radicals and carbon radicals are supplied to the surface of the antireflection film, and a mixed layer containing both radicals can be formed in the surface.

The sixth gas includes rare gas. In this way, since the sixth gas includes rare gas, in the fourteenth step, the mixed layer formed in the surface of an antireflection film can be removed from the surface, by energy received by plasma of the rare gas by a bias voltage.

In the seventh step, the organic film is etched using a third mask, with plasma generated in the processing container, after execution of the sixth step, and in the sixth step, the third mask is formed from the second mask and the antireflection film. In this way, by executing the sixth step, a third mask whose shape is maintained and selection ratio is improved is formed on the organic film regardless of the density of the mask, so that the etching of the organic film by using the mask of such a good shape is possible and the organic film can be etched well.

Advantageous Effects of Invention

As described above, a technique for avoiding wiggling of the mask caused by a protective film for protecting the mask while protecting the mask can be realized.

DESCRIPTION OF EMBODIMENTS

Figure 1:
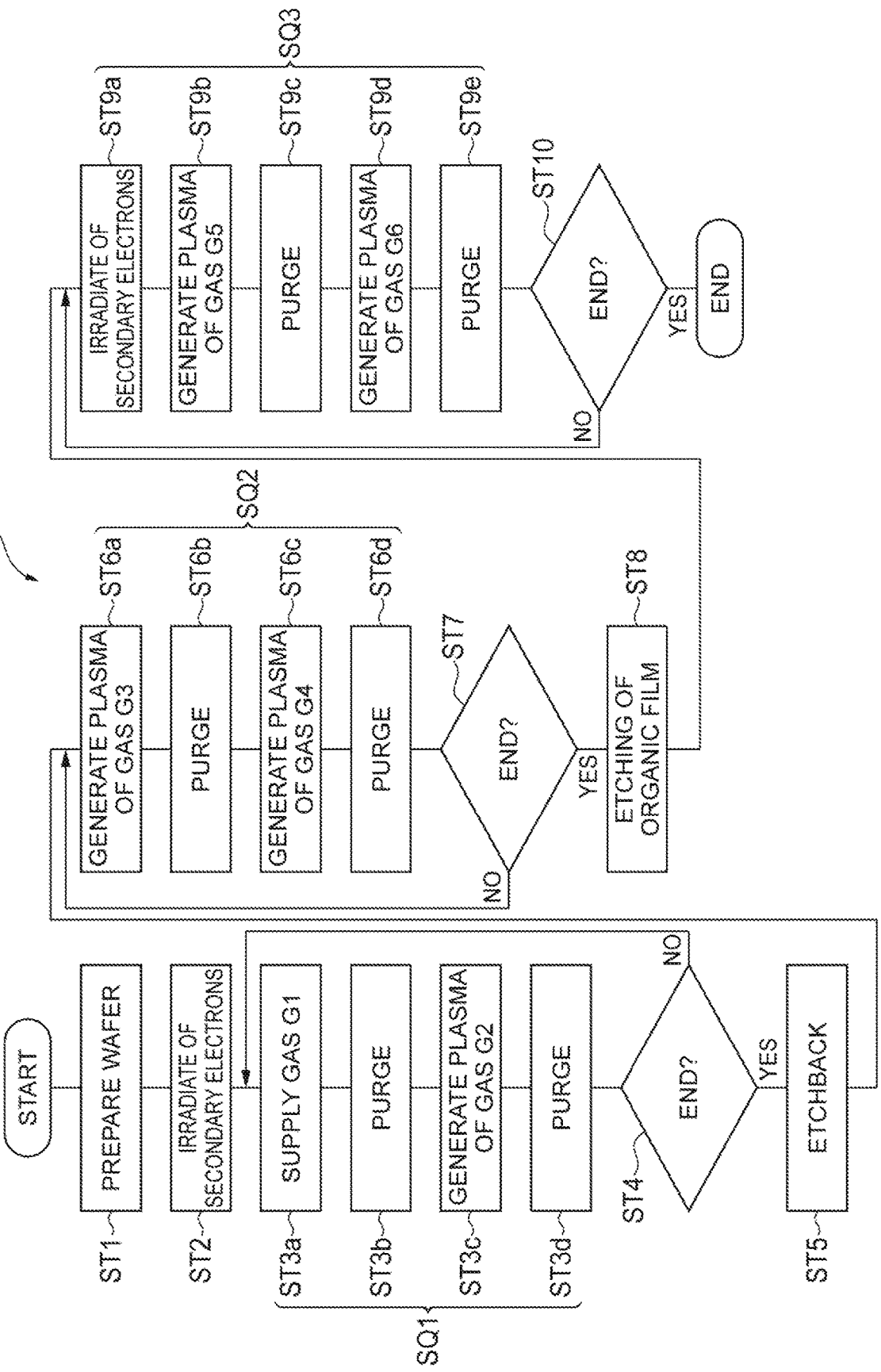
FIG. 1 is a flowchart illustrating a method of an embodiment.

Hereinafter, various embodiments will be described in detail with reference to the accompanying drawings. The same or equivalent parts in the drawings are denoted by the same reference numerals.

An etching method (method MT) which can be performed by using the plasma processing apparatus 10 will be described below with reference to FIG. 1. FIG. 1 is a flowchart illustrating a method of an embodiment. A method MT of an embodiment illustrated in FIG. 1 is a method of processing a workpiece (hereinafter, it may be referred to as "wafer"). The method MT is a method of etching the wafer. In the method MT of an embodiment, it is possible to execute a series of steps using a single plasma processing apparatus.

Figure 2:
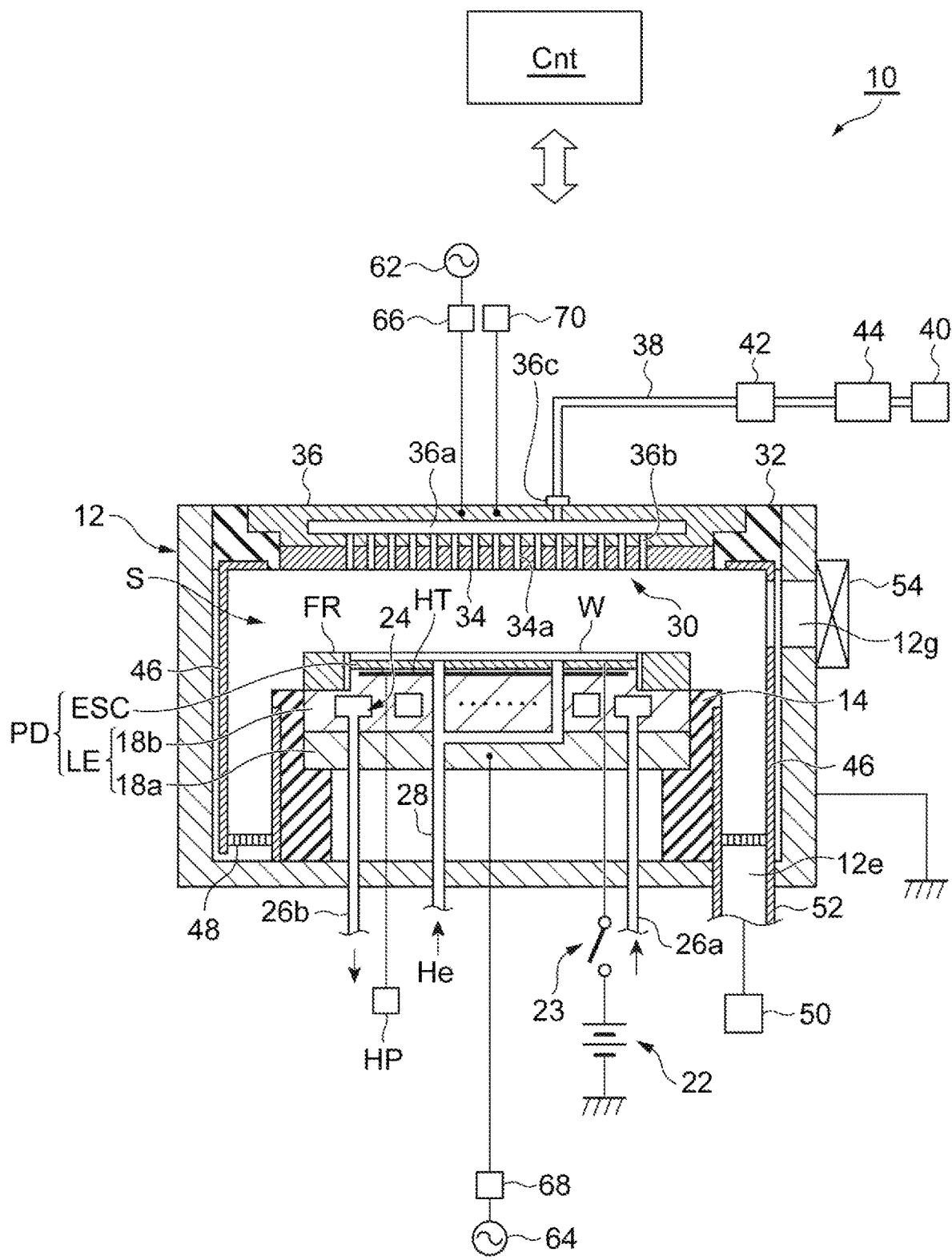
FIG. 2 is a diagram illustrating an example of a plasma processing apparatus.

FIG. 2 is a diagram illustrating an example of a plasma processing apparatus. FIG. 2 schematically illustrates a cross-sectional structure of a plasma processing apparatus 10 that can be used in various embodiments of the method for processing the workpiece. As illustrated in FIG. 2, the plasma processing apparatus 10 is a plasma etching apparatus provided with electrodes of parallel flat plates, and includes a processing container 12. The processing container 12 has a substantially cylindrical shape. The processing container 12 is made of, for example, aluminum, and its inner wall surface is subjected to anodic oxidation treatment. The processing container 12 is securely grounded.

A substantially cylindrical support portion 14 is provided on the bottom portion of the processing container 12. The support portion 14 is made of, for example, an insulating material. The insulating material constituting the support portion 14 may contain oxygen like quartz. The support portion 14 extends in the vertical direction from the bottom portion of the processing container 12, in the processing container 12. A placement table PD is provided in the processing container 12. The placement table PD is supported by the support portion 14.

The placement table PD supports a wafer W on the upper surface of the placement table PD. The placement table PD has a lower electrode LE and an electrostatic chuck ESC. The lower electrode LE includes a first plate 18a and a second plate 18b. The first plate 18a and the second plate 18b are made of metal such as aluminum, for example, and have a substantially disc shape. The second plate 18b is provided on the first plate 18a and is electrically connected to the first plate 18a.

On the second plate 18b, an electrostatic chuck ESC is provided. The electrostatic chuck ESC has a structure in which an electrode which is a conductive film is disposed between a pair of insulating layers or between a pair of insulating sheets. A DC power supply 22 is electrically connected to the electrode of the electrostatic chuck ESC through a switch 23. The electrostatic chuck ESC attracts the wafer W by an electrostatic force such as a Coulomb force generated by a DC voltage from the DC power supply 22. Thus, the electrostatic chuck ESC can hold the wafer W.

On the peripheral portion of the second plate 18b, a focus ring FR is disposed to surround the edge of the wafer W and the electrostatic chuck ESC. The focus ring FR is provided to improve etching uniformity. The focus ring FR is made of a material appropriately selected depending on the material of the film to be etched, and can be made of, for example, quartz.

Inside the second plate 18b, a coolant flow path 24 is provided. The coolant flow path 24 constitutes a temperature control mechanism. Coolant is supplied to the coolant flow path 24 from a chiller unit (not shown) provided outside the processing container 12 through a pipe 26a. The coolant supplied to the coolant flow path 24 is returned to the chiller unit through the pipe 26b. In this way, the coolant is supplied to the coolant flow path 24 so as to circulate. By controlling the temperature of the coolant, the temperature of the wafer W supported by the electrostatic chuck ESC is controlled.

The plasma processing apparatus 10 is provided with a gas supply line 28. The gas supply line 28 supplies heat transfer gas, for example He gas, from the heat transfer gas supply mechanism to between the upper surface of the electrostatic chuck ESC and the back surface of the wafer W.

In the plasma processing apparatus 10, a heater HT as a heating element is provided. For example, the heater HT is embedded in the second plate 18b. A heater power supply HP is connected to the heater HT. By supplying power from the heater power supply HP to the heater HT, the temperature of the placement table PD is adjusted, and the temperature of the wafer W placed on the placement table PD is adjusted. The heater HT may be incorporated in the electrostatic chuck ESC.

The plasma processing apparatus 10 includes an upper electrode 30. The upper electrode 30 is disposed to face the placement table PD, above the placement table PD. The lower electrode LE and the upper electrode 30 are provided in substantially parallel to each other. Between the upper electrode 30 and the lower electrode LE, a processing space S for performing a plasma process on the wafer W is provided.

The upper electrode 30 is supported on the upper part of the processing container 12 through an insulating shielding member 32. The insulating shielding member 32 is made of an insulating material, and contains oxygen, such as quartz, for example. The upper electrode 30 may include an electrode plate 34 and an electrode support 36. The electrode plate 34 faces the processing space S, and the electrode plate 34 is provided with a plurality of gas discharge holes 34a. The electrode plate 34 contains silicon in an embodiment. In another embodiment, the electrode plate 34 may contain silicon oxide.

The electrode support 36 detachably supports the electrode plate 34, and can be made of a conductive material such as aluminum, for example. The electrode support 36 may have a water cooling structure. Inside the electrode support 36, a gas diffusion chamber 36a is provided. A plurality of gas flow holes 36b communicating with the gas discharge holes 34a extend downward from the gas diffusion chamber 36a. A gas inlet 36c for guiding the processing gas to the gas diffusion chamber 36a is formed in the electrode support 36, and a gas supply pipe 38 is connected to the gas inlet 36c.

A gas source group 40 is connected to the gas supply pipe 38, through a valve group 42 and a flow rate controller group 44. The gas source group 40 has a plurality of gas sources. The plurality of gas sources are a source of an organic-containing aminosilane-based gas, a source of a fluorocarbon-based gas ($C_xF_y$ gas (x and y are integers of 1 to 10)), a source of a gas having oxygen atoms and carbon atoms (for example, carbon dioxide gas, or the like), a source of nitrogen gas, a source of hydrogen-containing gas, and a source of rare gas. As the fluorocarbon-based gas, any fluorocarbon-based gas such as $CF_4$ gas, $C_4F_6$ gas, and $C_4F_8$ gas can be used. As the aminosilane-based gas, one having a molecular structure with a relatively small number of amino groups can be used. For example, mono aminosilane ($H_3$—Si—R (R is an amino group that contains organic matter and may be substituted)) can be used. Further, the aminosilane-based gas (gas contained in a gas G1 to be described later) can contain aminosilane which may have one to three silicon atoms, or can contain aminosilane having one to three amino groups. Aminosilane having one to three silicon atoms may be monosilane (mono aminosilane) having one to three amino groups, disilane having one to three amino groups, or trisilane having one to three amino groups. Furthermore, the above-mentioned aminosilane may have an amino group which may be substituted. Further, the above-mentioned amino group can be substituted by any one of a methyl group, an ethyl group, a propyl group, and a butyl group. Further, the methyl group, the ethyl group, the propyl group, and the butyl group, which are above mentioned, can be substituted by halogen. As the rare gas, any rare gas such as Ar gas and He gas may be used.

The valve group 42 includes a plurality of valves, and the flow rate controller group 44 includes a plurality of flow rate controllers such as a mass flow controller. Each of the plurality of gas sources of the gas source group 40 is connected to a gas supply pipe 38 through the corresponding valve of the valve group 42 and the corresponding flow rate controller of the flow rate controller group 44. Therefore, the plasma processing apparatus 10 can supply gas from one or more gas sources selected from among the plurality of gas sources of the gas source group 40 into the processing container 12 at individually adjusted flow rates.

In the plasma processing apparatus 10, a deposit shield 46 is detachably provided along the inner wall of the processing container 12. The deposit shield 46 is also provided on the outer periphery of the support portion 14. The deposit shield 46 prevents etching by-products (deposits) from adhering to the processing container 12, and can be made by coating an aluminum material with ceramics such as $Y_2O_3$. In addition to $Y_2O_3$, the deposit shield can be made of a material containing oxygen such as quartz, for example.

An exhaust plate 48 is provided on the bottom side of the processing container 12 and between the support portion 14 and the side wall of the processing container 12. The exhaust plate 48 can be made, for example, by covering an aluminum material with ceramics such as $Y_2O_3$. An exhaust port 12e is provided under the exhaust plate 48 and in the processing container 12. An exhaust device 50 is connected to the exhaust port 12e through an exhaust pipe 52. The exhaust device 50 includes a vacuum pump such as a turbo molecular pump, and can depressurize the space in the processing container 12 to a predetermined degree of vacuum. A loading/unloading port 12g for the wafer W is provided on a side wall of the processing container 12, and the loading/unloading port 12g can be opened and closed by a gate valve 54.

The plasma processing apparatus 10 further includes a first radio-frequency power supply 62 and a second radio-frequency power supply 64. The first radio-frequency power supply 62 is a power supply that generates a first radio-frequency power for plasma generation, and generates radio-frequency power of a frequency of 27 to 100 [MHz], in an example, 60 [MHz]. The first radio-frequency power supply 62 is connected to the upper electrode 30 through a matching unit 66. The matching unit 66 is a circuit that matches the output impedance of the first radio-frequency power supply 62 and the input impedance on the load side (lower electrode LE side). In addition, the first radio-frequency power supply 62 is connected to the lower electrode LE through the matching unit 66.

The second radio-frequency power supply 64 is a power supply that generates second radio-frequency power for attracting ions to the wafer W, that is, radio-frequency bias power, and generates a frequency within the range of 400 [kHz] to 40.68 [MHz], in an example, radio-frequency bias power with a frequency of 13.56 [MHz]. The second radio-frequency power supply 64 is connected to the lower electrode LE through the matching unit 68. The matching unit 68 is a circuit that matches the output impedance of the second radio-frequency power supply 64 and the input impedance on the load side (lower electrode LE side).

The plasma processing apparatus 10 further includes a power supply 70. The power supply 70 is connected to the upper electrode 30. The power supply 70 applies to the upper electrode 30, a voltage for attracting positive ions present in the processing space S to the electrode plate 34. In an example, the power supply 70 is a DC power supply that generates a negative DC voltage. When such a voltage is applied from the power supply 70 to the upper electrode 30, the positive ions present in the processing space S collide with the electrode plate 34. Thus, secondary electrons and/or silicon is released from the electrode plate 34.

In an embodiment, the plasma processing apparatus 10 may further include a control unit Cnt. The control unit Cnt is a computer including a processor, a storage unit, an input device, a display device, and the like, and controls each unit of the plasma processing apparatus 10. Specifically, the control unit Cnt is connected to the valve group 42, the flow rate controller group 44, the exhaust device 50, the first radio-frequency power supply 62, the matching unit 66, the second radio-frequency power supply 64, the matching unit 68, the power supply 70, the heater power supply HP, and the chiller unit.

The control unit Cnt operates according to a program based on the input recipe and sends out a control signal. It is possible to control the selection and flow rate of gas supplied from the gas source group 40, the exhaust by the exhaust device 50, the supply of power from the first radio-frequency power supply 62 and the second radio-frequency power supply 64, the voltage application from the power supply 70, the power supply from the heater power supply HP, the coolant flow rate and coolant temperature from the chiller unit, according to the control signal from the control unit Cnt. Each step of the method MT for processing the workpiece in this specification can be executed by operating each unit of the plasma processing apparatus 10 under the control by the control unit Cnt.

Figure 3:
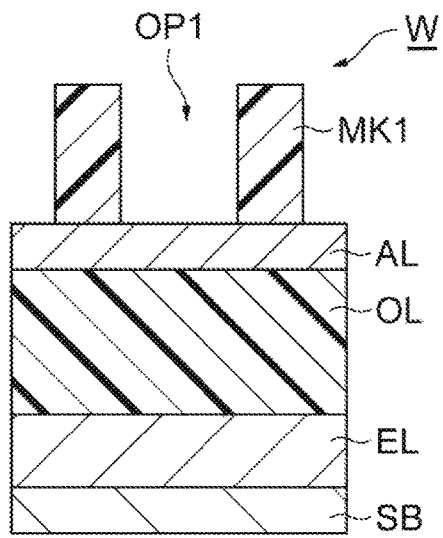
FIG. 3 is a cross-sectional view illustrating the state of a workpiece before and after execution of each step shown in FIG. 1, including parts (a), (b) and (c).
Figure 3:
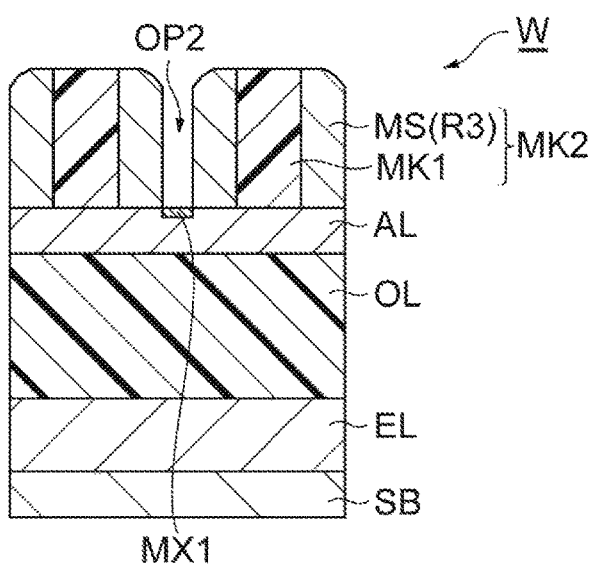
Figure 3:
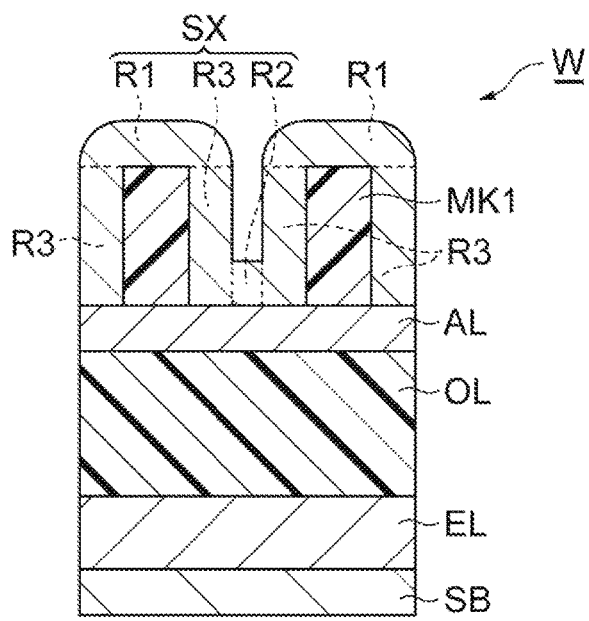

With reference to a part (a) of FIG. 3, the main configuration of a wafer W prepared in step ST1 of method MT illustrated in FIG. 1 will be explained. FIG. 3 is a cross-sectional view illustrating the state of the workpiece before and after execution of each step shown in FIG. 1.

As illustrated in part (a) of FIG. 3, the wafer W prepared in step ST1 includes a substrate SB, a layer EL to be etched, an organic film OL, an antireflection film AL, and a mask MK1 (second mask). The layer EL to be etched is provided on the substrate SB. The layer EL to be etched is a layer made of a material which is selectively etched with respect to the organic film OL, and an insulating film is used. The layer EL to be etched is made of, for example, silicon oxide ($SiO_2$). Further, the layer EL to be etched can be made of other materials such as polycrystalline silicon.

The organic film OL is provided on the layer EL to be etched. The organic film OL is a layer containing carbon, for example, a spin-on hard mask (SOH) layer. The antireflection film AL is a silicon-containing antireflection film and is provided on the organic film OL.

The mask MK1 is provided on the antireflection film AL. The mask MK1 is a resist mask made of a resist material, and is manufactured by patterning a resist layer by a photolithography technique. The mask MK1 is, for example, an ArF resist. The mask MK1 covers partially the antireflection film AL. The mask MK1 defines an opening OP1 partially exposing the antireflection film AL. The pattern of the mask MK 1 is, for example, a line and space pattern, but can have patterns of various other shapes such as a pattern that provides a circular opening in planar view and a pattern that provides an opening of an elliptical shape in planar view.

For example, a block copolymer such as polystyrene-block-polymethyl methacrylate (PS-b-PMMA) is used for the mask MK1, and the mask MK1 can be formed by using the phase separation structure of PS and PMMA.

Figure 4:
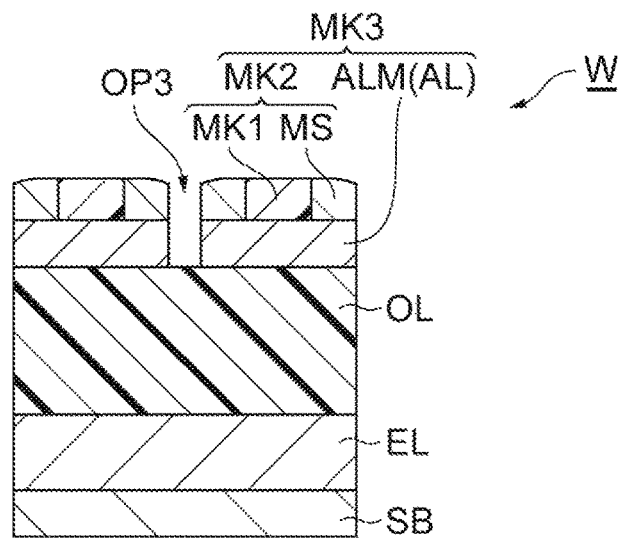
FIG. 4 is a cross-sectional view illustrating the state of the workpiece after execution of each step shown in FIG. 1, including parts (a), (b) and (c).
Figure 4:
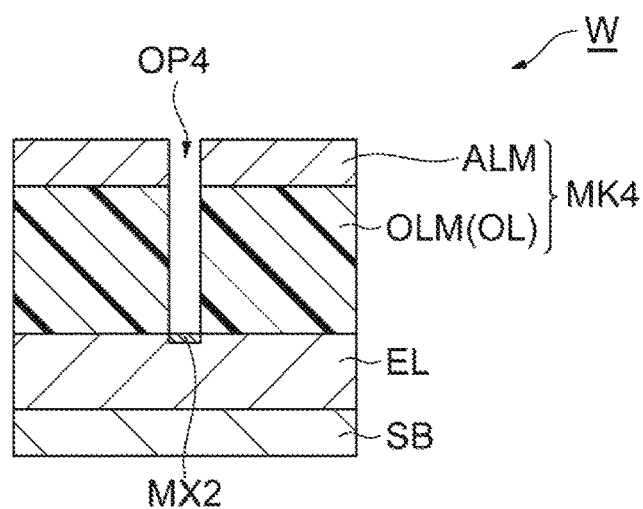
Figure 4:
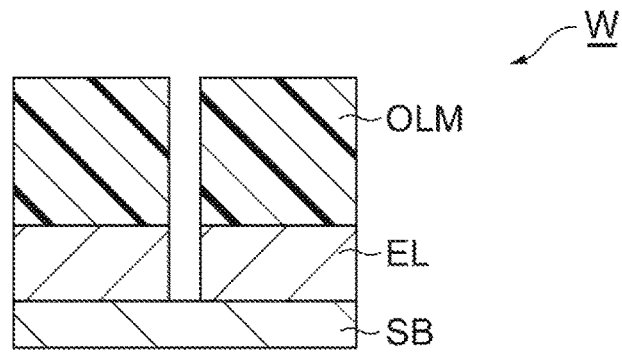
Figure 5:
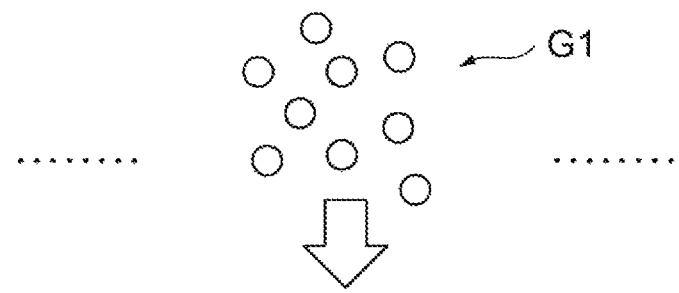
FIG. 5 is a diagram schematically illustrating a state in which a protective film is formed in a sequence of forming the protective film shown in FIG. 1.
Figure 5:
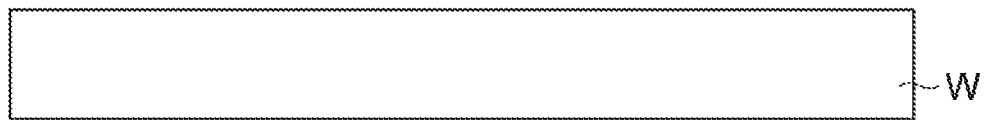
Figure 5:
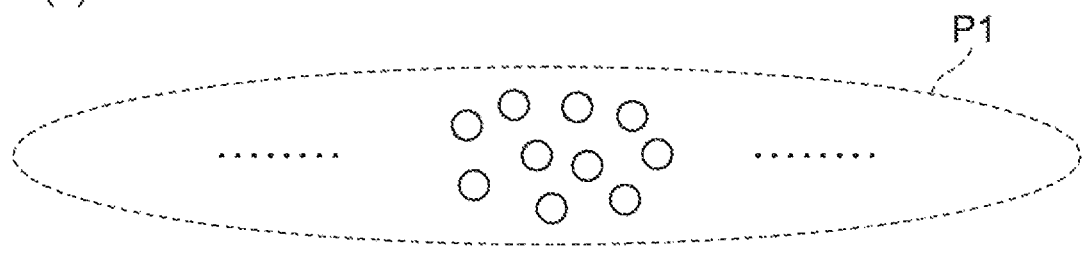
Figure 5:
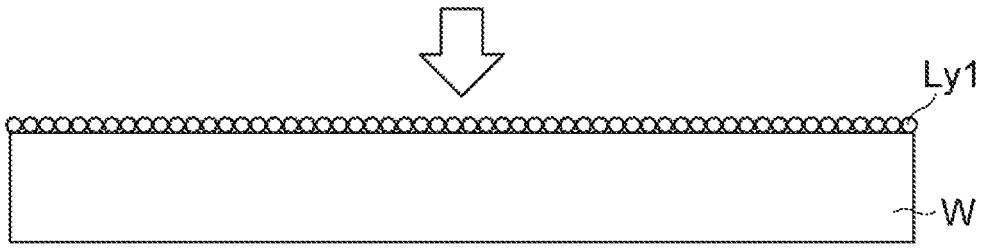
Figure 5:
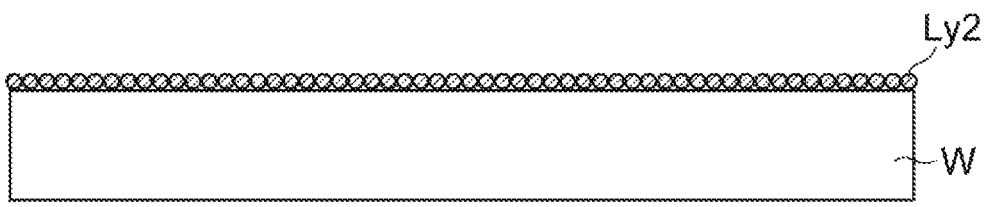

Returning to FIG. 1, the description of the method MT will be continued. In the following description, description will be made with reference to FIG. 3, FIG. 4, and FIG. 5 together with FIG. 1. FIG. 3 is a cross-sectional view illustrating the state of the workpiece before and after execution of each step shown in FIG. 1. FIG. 4 is a cross-sectional view illustrating the state of the workpiece after execution of each step of the method shown in FIG. 1. FIG. 5 is a diagram schematically illustrating a state in which a protective film is formed in a sequence of forming the protective film shown in FIG. 1.

In step ST1, a wafer W illustrated in the part (a) of FIG. 3 is prepared, and the wafer W is accommodated in the processing container 12 of the plasma processing apparatus 10 and placed on the electrostatic chuck ESC. In step ST1, the wafer W shown in part (a) of FIG. 3 is prepared as the wafer W shown in FIG. 2, and then step ST2 and subsequent steps are executed. A series of steps (sixth step) of step ST2 to step ST7 are steps of etching the antireflection film AL.

In step ST2 subsequent to step ST1, the wafer W is irradiated with secondary electrons. Step ST2 is a step of irradiating the mask MK1 with secondary electrons by generating plasma in the processing container 12 and applying a negative DC voltage to the upper electrode 30, before executing sequence SQ1 (second sequence) which conformally forms a protective film (protective film SX) of silicon oxide in the mask MK1 and step ST4.

As described above, since the mask MK1 is irradiated with secondary electrons before execution of a series of steps of the sequence SQ 1 to step ST4 forming the protective film SX, the mask MK1 can be modified before the formation of the protective film SX and the damage of the mask MK1 in the subsequent steps can be suppressed.

The processing contents of step ST2 will be described in detail. First, hydrogen-containing gas and rare gas are supplied into the processing container 12, and radio-frequency power is supplied from the first radio-frequency power supply 62, whereby plasma is generated in the processing container 12. Hydrogen-containing gas and rare gas from the gas source selected from among the plurality of gas sources of the gas source group 40 are supplied into the processing container 12. Accordingly, positive ions in the processing space S are drawn into the upper electrode 30, and the positive ions collide with the upper electrode 30. As positive ions collide with the upper electrode 30, secondary electrons are released from the upper electrode 30. By irradiating the wafer W with the released secondary electrons, the mask MK1 is modified. Further, as positive ions collide with the electrode plate 34, silicon as a constituent material of the electrode plate 34 is released together with the secondary electrons. The released silicon combines with oxygen released from the components of the plasma processing apparatus 10 exposed to the plasma. The oxygen is released from, for example, members such as the support portion 14, the insulating shielding member 32, and the deposit shield 46. The combination of silicon and oxygen produces a silicon oxide compound and the silicon oxide compound is deposited on the wafer W to cover and protect the mask MK1. In this way, in step ST2 of irradiating the mask MK1 with secondary electrons, by generating plasma in the processing container 12 to apply a negative DC voltage to the upper electrode 30, the mask MK1 is irradiated with secondary electrons and silicon is released from the electrode plate 34 to cover the mask MK1 with silicon oxide compound containing silicon. Then, after the mask MK1 is irradiated with secondary electrons to cover the mask MK1 with silicon oxide compound, the space inside the processing container 12 is purged, and the process proceeds to step ST2a.

As described above, in step ST2, the mask MK1 is covered with the silicon oxide compound, so that the damage of the mask MK1 in the subsequent steps can be further suppressed.

Subsequent to step ST2, sequence SQ1, step ST5, sequence SQ2 (third sequence), step ST7 (sequence SQ1 to step ST7) are sequentially executed. A series of steps of sequence SQ1 to step ST5 is a step of conformally forming a protective film SX of silicon oxide film on the surface of mask MK1, and a series of steps of sequence SQ2 to step ST7 is a step of precisely etching the antireflection film AL by removing the antireflection film AL for each atomic layer by using the mask MK1 on which the protective film SX of the silicon oxide film is formed, after execution of the series of steps of sequence SQ1 to step ST5. In this way, by executing a series of steps of sequence SQ1 to step ST5, a protective film SX having a conformal film thickness, which is precisely controlled, is formed on the mask regardless of the density difference of the mask, resistance to the etching of the mask is enhanced while maintaining the shape of mask, and by executing a series of steps of sequence SQ2 to step ST7, the mask selection ratio is enhanced, and an influence on the mask shape (line width roughness (LWR) and line edge roughness (LER)) by etching is reduced.

Subsequent to step ST2, sequence SQ1 is executed once or more. Sequence SQ1 and step ST4 are a step of conformally forming a protective film SX of silicon oxide with a uniform thickness on the wafer W by the same method as atomic layer deposition (ALD) method, and includes step ST3a (eighth step), step ST3b (ninth step), step ST3c (tenth step), and step ST3d (eleventh step) which are executed sequentially in sequence SQL In step ST3a, the gas G1 (third gas) is supplied into the processing container 12. Specifically, in step ST3a, as illustrated in a part (a) of FIG. 5, a gas G1 containing silicon is introduced into the processing container 12. The gas G1 includes an organic-containing aminosilane-based gas. The gas G1 of an organic-containing aminosilane-based gas is supplied from the gas source selected from among the plurality of gas sources of the gas source group 40 into the processing container 12. For the gas G1, as organic-containing aminosilane-based gas, for example, mono aminosilane ($H_3$—Si—R (R is an organic-containing amino group)) is used. In step ST3a, plasma of the gas G1 is not generated.

The molecules of the first gas G1 adhere to the surface of the wafer W as a reaction precursor (layer Ly1), as shown in part (b) of FIG. 5. The gas G1 molecule (mono aminosilane) adheres to the surface of the wafer W by chemical adsorption based on chemical bonds, and plasma is not used. In step ST3a, the temperature of the wafer W is about 0 degrees Celsius or more, and about the glass transition temperature of the material contained in the mask MK1 (for example, 200 degrees Celsius or less). It is also possible to use gases other than mono aminosilane as long as they can adhere to the surface by chemical bonds in the temperature range and contain silicon.

As described above, since the gas G1 includes an organic-containing aminosilane-based gas, in step ST3a, the reaction precursor (layer Ly1) of silicon is formed on the mask MK1 along the atomic layer of the surface of the mask MK1.

In step ST3b subsequent to step ST3a, the space inside the processing container 12 is purged. Specifically, the gas G1 supplied in step ST3a is exhausted. In step ST3b, as the purge gas, an inert gas such as nitrogen gas or rare gas (for example, Ar or the like) may be supplied to the processing container 12. That is, the purging in step ST3b may be any one of gas purging to flow inert gas into the processing container 12, or purging by evacuating. In step ST3b, molecules excessively attached on the wafer W can also be removed. Thus, the layer Ly1 of the reaction precursor becomes an extremely thin monomolecular layer.

In step ST3c subsequent to step ST3b, as shown in part (b) of FIG. 5, plasma P1 of the gas G2 (fourth gas) is generated in the processing container 12. The gas G2 includes gas containing oxygen atoms and carbon atoms, and may include, for example, carbon dioxide gas. In step ST3c, the temperature of the wafer W when the plasma P1 of the gas G2 is generated is about 0 degrees Celsius or more, and about the glass transition temperature of the material contained in the mask MK1 (for example, 200 degrees Celsius or less). The gas G2 including gas containing oxygen atoms and carbon atoms from the gas source selected from among the plurality of gas sources of the gas source group 40 is supplied into the processing container 12. Then, radio-frequency power is supplied from the first radio-frequency power supply 62. In this case, bias power of the second radio-frequency power supply 64 can be applied. It is also possible to generate plasma using only the second radio-frequency power supply 64 without using the first radio-frequency power supply 62. The pressure in the space inside the processing container 12 is set to a preset pressure by operating the exhaust device 50. In this way, the plasma P1 of the gas G2 is generated in the processing container 12.

As shown in part (b) of FIG. 5, when the plasma P1 of the gas G2 is generated, an active species of oxygen and an active species of carbon, for example, an oxygen radical, and a carbon radical are generated, and as shown in part (c) of FIG. 5, a layer Ly2 (corresponding to a protective film SX) which is a silicon oxide film is formed as a monomolecular layer. Since carbon radicals can have a function of suppressing oxygen erosion to the mask MK1, a silicon oxide film can be stably formed on the surface of the mask MK1 as a protective film. Since the binding energy of the Si—O bond of the silicon oxide film is about 192 [kcal], and is higher than the binding energy (about 50-110 [kcal], about 70 to 110 [kcal], about and 100 to 120 [kcal]) of the C—C bond, C—H bond, C—F bond, respectively, the silicon oxide film can function as a protective film.

As described above, since the gas G2 includes oxygen atoms, in step ST3c, the oxygen atom bonds with the silicon reaction precursor (layer Ly1) provided on the mask MK1, so that the layer Ly2 of a silicon oxide film can be formed conformally on the mask MK1. Further, since the gas G2 includes carbon atoms, erosion by oxygen atoms against the mask MK1 can be suppressed by the carbon atoms. Therefore, in sequence SQ1, as in the ALD method, by executing sequence SQ1 once (unit cycle), the layer Ly2 of the silicon oxide film can be formed conformally with a thin and uniform film thickness on the surface of the wafer W, regardless of the density of the mask MK1.

In step ST3d subsequent to step ST3c, the space inside the processing container 12 is purged. Specifically, the gas G2 supplied in step ST3c is exhausted. In step ST3d, as the purge gas, an inert gas such as nitrogen gas or rare gas (for example, Ar or the like) may be supplied to the processing container 12. That is, the purging in step ST3d may be any one of gas purging to flow inert gas into the processing container 12, or purging by evacuating.

In step ST4 subsequent to sequence SQ1, it is determined whether or not the execution of sequence SQ1 is to be ended. Specifically, in step ST4, it is determined whether or not the number of executions of sequence SQ1 has reached the preset number. Determination of the number of executions of sequence SQ1 is to determine the thickness of the film of the protective film SX formed on the wafer W shown in part (b) of FIG. 3. That is, the film thickness of the protective film SX finally formed on the wafer W can be substantially determined by the product of the film thickness of the silicon oxide film formed by executing sequence SQ1 once (unit cycle) and the number of executions of sequence SQ1. Therefore, the number of executions of sequence SQ1 can be set according to the desired thickness of the protective film SX formed on the wafer W. In this way, by repeating sequence SQ1, the protective film SX of the silicon oxide film is conformally formed on the surface of the mask MK1.

In a case where it is determined in step ST4 that the number of executions of sequence SQ1 has not reached the preset number (step ST4: NO), the execution of sequence SQ1 is repeated again. On the other hand, in a case where it is determined in step ST4 that the number of executions of sequence SQ1 has reached the preset number (step ST4: YES), the execution of sequence SQ1 is ended. Thus, as illustrated in part (b) of FIG. 3, a protective film SX which is a silicon oxide film is formed on the surface of the wafer W. That is, by repeating sequence SQ1 a preset number of times, a protective film SX having a preset film thickness is conformally formed on the surface of the wafer W with a uniform film thickness, regardless of the density of the mask MK1. The thickness of the film of the protective film SX provided on the mask MK1 is precisely controlled by repeating sequence SQL As described above, in a series of steps of sequence SQ1 and step ST4, the protective film SX can be conformally formed on the surface of the mask MK1, by the same method as the ALD method.

The protective film SX formed in the series of steps of sequence SQ1 and step ST4 includes an area R1, an area R2 and an area R3, as shown in part (b) of FIG. 3. The area R3 is the area extending along the side surface on the side surface of the mask MK1. The area R3 extends from the surface of the antireflection film AL to the lower side of the area R1. The area R1 extends on the upper surface of the mask MK1 and on the area R3. The area R2 extends between adjacent areas R3, and on the surface of the antireflection film AL. As described above, in the sequence SQ1, the protective film SX is formed as in the ALD method, so that the area R1, the area R2, and the area R3 have substantially the same film thickness, regardless of the density of the mask MK1.

In step ST5 subsequent to step ST4, the protective film SX is etched (etchbacked) so as to remove the area R1 and the area R2. For removal of the area R1 and the area R2, anisotropic etching conditions are necessary. Therefore, in step ST5, a processing gas ($C_xF_y$ is $CF_4$, $C_4F_3$, and $CHF_3$) including fluorocarbon-based gas from the gas source selected from among the plurality of gas sources of the gas source group 40 is supplied into the processing container 12. Then, radio-frequency power is supplied from the first radio-frequency power supply 62, radio frequency bias power is supplied from the second radio-frequency power supply 64, and the pressure of the space inside the processing container 12 is set to a preset pressure by operating the exhaust device 50. In this case, in order to promote anisotropic etching, a low-pressure direction (20 or less [mT]) is preferable in order to extend mean free path. In this way, plasma of fluorocarbon-based gas is generated. The fluorine-containing active species in the generated plasma preferentially etches the area R1 and the area R2 by attraction in the vertical direction by the radio frequency bias power. As a result, as shown in part (c) of FIG. 3, the area R1 and the area R2 are selectively removed, and the mask MS is formed by the remaining area R3. The mask MS and the mask MK1 constitutes the mask MK2 on the surface of the antireflection film AL.

Subsequent to step ST5, a series of steps of sequence SQ2 to step ST7 are executed. A series of steps of sequence SQ2 to step ST7 are steps of etching the antireflection film AL.

First, subsequent to step ST5, sequence SQ2 is executed once or more. Sequence SQ2 is a series of steps for precisely etching the area of the antireflection film AL not covered with the mask MK2 with a high selection ratio regardless of the density of the mask MK2 by the same method as the atomic layer etching (ALE) method, and includes step ST6a (twelfth step), step ST6b (thirteenth step), step ST6c (fourteenth step), and step ST6d (fifteenth step) sequentially executed in sequence SQ2.

In step ST6a, plasma of a gas G3 (fifth gas) is generated in the processing container 12, and a mixed layer MX1 containing radicals contained in the plasma is formed in the atomic layer of the surface of the antireflection film AL. In step ST6a, in a state where the wafer W is placed on the electrostatic chuck ESC, a gas G3 is supplied into the processing container 12 to generate plasma of the gas G3. The gas G3 is an etchant gas suitable for etching of antireflection film AL containing silicon, including fluorocarbon-based gas and rare gas, which can be for example, $C_xF_y$/Ar gas. $C_xF_y$ can be $CF_4$. Specifically, the gas G3 including fluorocarbon-based gas and rare gas from the gas source selected from among the plurality of gas sources of the gas source group 40 is supplied into the processing container 12. Then, radio-frequency power is supplied from the first radio-frequency power supply 62, radio frequency bias power is supplied from the second radio-frequency power supply 64, and the pressure of the space inside the processing container 12 is set to a preset pressure by operating the exhaust device 50. In this way, the plasma of the gas G3 is generated in the processing container 12. The plasma of the gas G3 contains carbon radicals and fluorine radicals.

Figure 6:
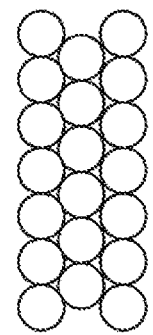
FIG. 6 is a diagram illustrating the principle of etching in the method illustrated in FIG. 1.
Figure 6:
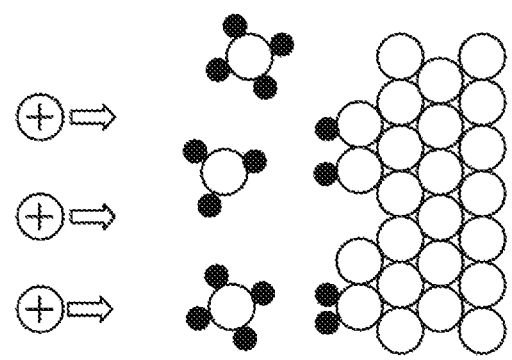
Figure 6:
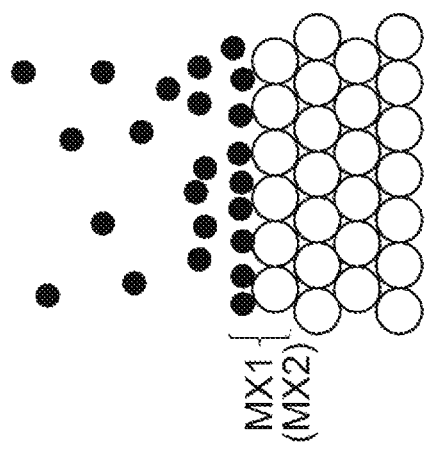

FIG. 6 is a diagram illustrating the principle of etching in the method (sequence SQ2, and sequence SQ3 to be described later) illustrated in FIG. 1. In FIG. 6, hollow circles (white circles) indicate atoms constituting the antireflection film AL, solid circles (black circles) indicate radicals, and "+" surrounded by circles indicates the ions of atoms of rare gas (for example, ions of Ar atoms) included in a gas G4 (sixth gas) to be described later. As shown in part (a) of FIG. 6, in step ST6a, carbon radicals and fluorine radicals contained in the plasma of the gas G3 are supplied to the surface of the antireflection film AL. In this way, in step ST6a, a mixed layer MX1 containing atoms constituting the antireflection film AL, carbon radicals and fluorine radicals is formed in the surface of the antireflection film AL. (see part (a) of FIG. 6 and part (c) of FIG. 3).

As described above, since the gas G3 includes fluorocarbon-based gas, in step ST6a, fluorine radicals and carbon radicals are supplied to the atomic layer of the surface of the antireflection film AL, and the mixed layer MX1 containing both radicals can be formed in the atomic layer.

In addition, in the mask MK1 of the ArF resist, Si of the mask MS included in the mask MK2 and the carbon radicals contained in the plasma of the gas G3 function as a protective film. In addition, the adjustment of the amount of fluorine radicals can be controlled by a DC voltage by the power supply 70.

In step ST6b subsequent to step ST6a, the space inside the processing container 12 is purged. Specifically, the gas G3 supplied in step ST6a is exhausted. In step ST6b, as the purge gas, an inert gas such as nitrogen gas or rare gas (for example, Ar gas or the like) may be supplied to the processing container 12. That is, the purging in step ST6b may be any one of gas purging to flow inert gas into the processing container 12, or purging by evacuating.

In step ST6c subsequent to step ST6b, plasma of the gas G4 is generated in the processing container 12 and a bias voltage is applied to the plasma to remove the mixed layer MX1. The gas G4 includes rare gas, and may include, for example, Ar gas. Specifically, the gas G4 including rare gas (for example, Ar gas) is supplied from the selected gas source among the plurality of gas sources of the gas source group 40 into the processing container 12, radio-frequency power is supplied from the first radio-frequency power supply 62, radio frequency bias power is supplied from the second radio-frequency power supply 64, and the pressure in the space inside the processing container 12 is set to a preset pressure by operating the exhaust device 50. In this way, the plasma of the gas G4 is generated in the processing container 12. The ions of the atoms of the gas G4 in the generated plasma (for example, the ions of Ar atoms) collide with the mixed layer MX1 in the surface of the antireflection film AL by attraction in the vertical direction by the radio frequency bias power, and the energy is supplied to the mixed layer MX1. As shown in the part (b) of FIG. 6, in step ST6c, energy is supplied to the mixed layer MX1 formed in the surface of the antireflection film AL through the ions of the atoms of the gas G4, and this energy removes the mixed layer MX from the antireflection film AL.

As described above, since the gas G4 includes rare gas, in step ST6c, the mixed layer MX1 formed in the surface of the antireflection film AL can be removed from the surface by energy received by plasma of the rare gas by a bias voltage.

In step ST6d subsequent to step ST6c, the space inside the processing container 12 is purged. Specifically, the gas G4 supplied in step ST6c is exhausted. In step ST6d, as the purge gas, an inert gas such as nitrogen gas or rare gas (for example, Ar gas or the like) may be supplied to the processing container 12. That is, the purging in step ST6d may be any one of gas purging to flow inert gas into the processing container 12, or purging by evacuating. As shown in the part (c) of FIG. 6, by purging performed in step ST6c, atoms constituting the mixed layer in the surface of the antireflection film AL and excessive ions contained in the plasma of the gas G4 (for example, ions of Ar atoms) can be sufficiently removed.

In step ST7 subsequent to sequence SQ2, it is determined whether or not to end the execution of sequence SQ2. Specifically, in step ST7, it is determined whether or not the number of executions of sequence SQ2 has reached the preset number. To determine the number of executions of the sequence SQ 2 is to determine the extent (depth) of etching for antireflection film AL. Sequence SQ2 can be repeatedly performed so as to etch the antireflection film AL to the surface of the organic film OL. That is, the execution number of sequence SQ2 can be determined such that the product of the thickness of antireflection film AL etched by executing sequence SQ2 once (unit cycle) and the number of executions of sequence SQ2 is the total thickness of antireflection film AL itself. Therefore, according to the thickness of the antireflection film AL, the number of executions of sequence SQ2 can be set.

In a case where it is determined in step ST7 that the number of executions of sequence SQ2 has not reached the preset number (step ST7: NO), the execution of sequence SQ2 is repeated again. On the other hand, in a case where it is determined in step ST7 that the number of executions of sequence SQ2 has reached the preset number (step ST7: YES), the execution of sequence SQ2 is ended. Thus, as shown in part (a) of FIG. 4, the antireflection film AL is etched and a mask ALM is formed. That is, by repeating the sequence SQ 2 a preset number of times, the antireflection film AL is etched at the same and uniform width as the width of the opening OP2 provided by the mask MK2 regardless of the density of the mask MK2 (the density of the mask MK1), and the selection ratio is also improved.

The mask ALM and the mask MK2 provide an opening OP3. The opening OP3 has the same width as the width of the opening OP 2 provided by mask MK2 (see the part (c) of FIG. 3). The mask MK2 and the mask ALM constitute the mask MK 3 (third mask) for the organic film OL. The width of the opening OP3 formed by etching the antireflection film AL is controlled with high accuracy by repeating sequence SQ2.

Further, since a stable silicon oxide film with a uniform and precisely controlled film thickness is formed on the side of the mask MK2 on the antireflection film AL in a series of steps up to step ST5, the influence on the shape (LWR and LER) of the mask MK2 due to etching of the antireflection film AL in sequence SQ2 can be reduced. In this way, since the influence on the shape of the mask MK2 due to etching in sequence SQ2 can be reduced, the influence on the width of the opening OP3 formed by etching due to etching in sequence SQ2 can also be reduced and the influence due to the density of the mask MK2 (the density of the mask MK1) can be reduced.

As described above, a series of steps of sequence SQ2 to step ST7 is a step executed after executing the step of conformally forming a silicon oxide film (the area R3 (mask MS) of the protective film SX) on the surface of the mask MK1 (after execution of step ST5), and is a step of precisely etching the antireflection film AL by repeatedly executing sequence SQ2 by using the mask MK1 (mask MK2) on which the mask MS is formed to remove the antireflection film AL for each atomic layer. Therefore, in a series of steps of sequence SQ2 to step ST7, the antireflection film AL can be removed for each atomic layer by the same method as the ALE method.

In step ST8 (seventh step) subsequent to step ST7:YES, the organic film OL is etched. In step ST8, after executing sequence SQ1 to step ST7 in which the etching process is performed on the antireflection film AL (after step ST7: YES), by using the plasma generated in the processing container 12, the etching process is performed on the organic film OL by using the mask MK3. The mask MK3 is formed from the antireflection film AL in the step of etching the antireflection film AL (sequence SQ1 to step ST7).

The process of step ST8 will be specifically described. First, a processing gas including nitrogen gas and hydrogen-containing gas is supplied into the processing container 12 from the gas source selected from among the plurality of gas sources of the gas source group 40. As the gas, a processing gas including oxygen may be used. Then, radio-frequency power is supplied from the first radio-frequency power supply 62, radio frequency bias power is supplied from the second radio-frequency power supply 64, and the pressure of the space inside the processing container 12 is set to a predetermined pressure by operating the exhaust device 50. Thus, plasma of the processing gas including nitrogen gas and hydrogen-containing gas is generated. Hydrogen radicals, which are the active species of hydrogen in the generated plasma, etch the area exposed from the mask MK 3 of the entire area of the organic film OL. As described above, as shown in part (b) of FIG. 4, the organic film OL is etched, so that a mask OLM having the opening OP4 with the same width as the width of the opening OP3 provided by the mask MK3 (see the part (a) of FIG. 4) is formed from the organic film OL. The mask ALM and the mask OLM constitute a mask MK4 (first mask) for the layer EL to be etched. Since the width uniformity of the opening OP3 of the mask MK3 is improved by sequence SQ2 regardless of the density of the mask MK3 (density of the mask MK2) and the shape (LWR and LER) of the mask MK3 is also good, the width uniformity of the opening OP4 of the mask MK4 is also improved regardless of the density of the mask MK4 (density of the mask MK3) and the shape (LWR and LER) of the mask MK4 is also good.

As described above, by executing a series of steps from step ST2 to ST7, a mask MK3 whose shape is maintained and selection ratio is improved is formed on the organic film OL regardless of the density of the mask, so that the etching of the organic film OL by using the mask MK3 of such a good shape is possible and the organic film OL can be etched well.

Subsequent to step ST18, sequence SQ3 (first sequence) and step ST10 are executed. Sequence SQ3 and step ST10 are a series of steps of etching the layer EL to be etched by removing the layer EL to be etched for each atomic layer.

Sequence SQ3 includes step ST9*a* (first step), step ST9*b* (second step), step ST9*c* (third step), step ST9*d* (fourth step), and step ST9 (fifth step).

In step ST9*a*, the mask MK4 is irradiated with secondary electrons by generating plasma in the processing container 12 of the plasma processing apparatus 10 and applying a negative DC voltage to the upper electrode 30 of a parallel plate electrode provided in the processing container 12, and the mask MK4 is converted with silicon oxide compound containing silicon by releasing silicon from the electrode plate 34 provided in the upper electrode 30 and containing silicon. Then, after the mask MK4 is covered with silicon oxide compound, the space inside the processing container 12 is purged, and then the process proceeds to step ST9*b*.

The processing contents of step ST9*a* will be described in detail. First, hydrogen-containing gas and rare gas (for example, Ar gas) are supplied into the processing container 12, and radio-frequency power is supplied from the first radio-frequency power supply 62, whereby plasma is generated in the processing container 12.

Hydrogen-containing gas and rare gas (for example, Ar gas) from the gas source selected from among the plurality of gas sources of the gas source group 40 are supplied into the processing container 12. Accordingly, positive ions in the processing space S are drawn into the upper electrode 30, and the positive ions collide with the upper electrode 30. As positive ions collide with the upper electrode 30, secondary electrons are released from the upper electrode 30. By irradiating the wafer W with the released secondary electrons, the mask MK1 is modified. Further, as positive ions collide with the electrode plate 34, silicon as a constituent material of the electrode plate 34 is released together with the secondary electrons. The released silicon combines with oxygen released from the components of the plasma processing apparatus 10 exposed to the plasma. The oxygen is released from, for example, members such as the support portion 14, the insulating shielding member 32, and the deposit shield 46. The combination of silicon and oxygen produces a silicon oxide compound and the silicon oxide compound is deposited on the wafer W to cover and protect the mask MK4. Then, after the mask MK4 is irradiated with secondary electrons to cover the mask MK4 with silicon oxide compound, the space inside the processing container 12 is purged, and the process proceeds to step ST9*b*.

In this way, in step ST9*a*, by generating plasma in the processing container 12 to apply a negative DC voltage to the upper electrode 30, the mask MK4 is irradiated with secondary electrons and silicon is released from the electrode plate 34 to cover the mask MK4 with silicon oxide compound containing silicon. Accordingly, in step ST9*a*, the mask MK4 is covered with the silicon oxide compound, so that the damage of the mask MK4 in the subsequent steps can be suppressed.

In step ST9*b* subsequent to step ST9*a*, by the method as in step ST6*a*, plasma of a gas G5 (first gas) is generated in the processing container 12, and a mixed layer MX2 including radicals contained in the plasma is formed in the atomic layer of the surface of the layer EL to be etched. In step ST9*b*, in a state where the wafer W is placed on the electrostatic chuck ESC, the gas G5 is supplied into the processing container 12 to generate plasma of the gas G5. The gas G5 is an etchant gas suitable for etching of the layer EL to be etched, including fluorocarbon-based gas and rare gas, which can be for example, $C_xF_y$/Ar gas. $C_xF_y$ can be $CF_4$. Specifically, the gas G5 including fluorocarbon-based gas and rare gas from the gas source selected from among the plurality of gas sources of the gas source group 40 is supplied into the processing container 12. Then, radio-frequency power is supplied from the first radio-frequency power supply 62, radio frequency bias power is supplied from the second radio-frequency power supply 64, and the pressure of the space inside the processing container 12 is set to a preset pressure by operating the exhaust device 50. In this way, the plasma of the gas G5 is generated in the processing container 12. The plasma of the gas G5 contains carbon radicals and fluorine radicals. In step ST9*b*, the mixed layer MX2 including carbon radicals and fluorine radicals is formed in the atomic layer of the surface of the layer EL to be etched (see the part (a) of FIG. 6 and the part (b) of FIG. 4). Accordingly, since the gas G5 includes fluorocarbon-based gas, in step ST9*b*, fluorine radicals and carbon radicals are supplied to the atomic layer of the surface of the layer EL to be etched, and the mixed layer MX2 including both radicals can be formed in the atomic layer.

In step ST9*c* subsequent to step ST9*b*, the space inside the processing container 12 is purged by the method as in the step ST6*b*. Specifically, the gas G5 supplied in step ST9*b* is exhausted. In step ST9*c*, as the purge gas, an inert gas such as nitrogen gas or rare gas (for example, Ar gas or the like) may be supplied to the processing container 12. That is, the purging in step ST9*c* may be any one of gas purging to flow inert gas into the processing container 12, or purging by evacuating.

In step ST9*d* subsequent to step ST9*c*, by the method as in the step ST6*c*, plasma of the gas G6 (second gas) is generated in the processing container 12 and a bias voltage is applied to the plasma to remove the mixed layer MX2. The gas G6 includes rare gas, and may include, for example, Ar gas. Specifically, the gas G6 including rare gas (for example, Ar gas) is supplied from the gas source selected from among the plurality of gas sources of the gas source group 40 into the processing container 12, radio-frequency power is supplied from the first radio-frequency power supply 62, radio frequency bias power is supplied from the second radio-frequency power supply 64, and the pressure in the space inside the processing container 12 is set to a preset pressure by operating the exhaust device 50. In this way, the plasma of the gas G6 is generated in the processing container 12. The ions of the atoms of the gas G6 in the generated plasma (for example, the ions of Ar atoms) collide with the mixed layer MX2 of the surface of the layer EL to be etched by attraction in the vertical direction by the radio frequency bias power, and the energy is supplied to the mixed layer MX2. As shown in the part (b) of FIG. 6, in step ST6*c*, energy is supplied to the mixed layer MX2 formed in the surface of the layer EL to be etched through the ions of the atoms of the gas G6, and this energy removes the mixed layer MX2 from the layer EL to be etched.

As described above, since the gas G6 includes rare gas, in step ST9*d*, the mixed layer MX2 foiled in the surface of the layer EL to be etched can be removed from the surface by energy received by plasma of the rare gas by a bias voltage.

In step ST9*e* subsequent to step ST9*d*, the space inside the processing container 12 is purged by the method as in the step ST6*d*. Specifically, the gas G6 supplied in step ST9*d* is exhausted. In step ST9*e*, as the purge gas, an inert gas such as nitrogen gas or rare gas (for example, Ar gas or the like) may be supplied to the processing container 12. That is, the purging in step ST9*e* may be any one of gas purging to flow inert gas into the processing container 12, or purging by evacuating. As shown in the part (c) of FIG. 6, by purging performed in step ST9*e*, atoms constituting the mixed layer MX2 in the surface of the layer EL to be etched and excessive ions contained in the plasma of the gas G6 (for example, ions of Ar atoms) can be sufficiently removed. Therefore, in a series of steps of sequence SQ3 to step ST10, the layer EL to be etched can be removed for each atomic layer by the same method as the ALE method.

In step ST10 subsequent to sequence SQ3, it is determined whether or not to end the execution of sequence SQ3 by the method as in the step ST7. Specifically, in step ST10, it is determined whether or not the number of executions of sequence SQ3 has reached the preset number. To determine the number of executions of the sequence SQ3 is to determine the extent (depth) of etching for the layer EL to be etched. Sequence SQ3 can be repeated so as to etch the layer EL to be etched to the surface of the substrate SB. That is, the execution number of sequence SQ3 can be determined such that the product of the thickness of the layer EL to be etched which is etched by executing sequence SQ3 once (unit cycle) and the number of executions of sequence SQ3 is the total thickness of the layer EL to be etched itself. Therefore, according to the thickness of the layer EL to be etched, the number of executions of sequence SQ3 can be set.

In a case where it is determined in step ST10 that the number of executions of sequence SQ3 has not reached the preset number (step ST10: NO), the execution of sequence SQ3 is repeated again. On the other hand, in a case where it is determined in step ST10 that the number of executions of sequence SQ3 has reached the preset number (step ST10: YES), the execution of sequence SQ3 is ended. Thus, as shown in part (c) of FIG. 4, the layer EL to be etched is etched. That is, by repeating sequence SQ3 a preset number of times, the layer EL to be etched is etched at the same and uniform width as the width of the opening OP4 (see the part (b) in FIG. 4) provided by the mask MK4 regardless of the density of the mask MK4 (the density of the mask MK1), and the selection ratio is also improved. The width of the opening OP4 formed by etching the layer EL to be etched is controlled with high accuracy by repeating sequence SQ3.

Since the silicon oxide compound is formed on the side of the mask MK4 on the layer EL to be etched in step ST9a, the influence on the shape (LWR and LER) of the mask MK4 due to etching of the layer EL to be etched in sequence SQ3 can be reduced. In this way, since the influence on the shape of the mask MK4 due to etching in sequence SQ3 can be reduced, the influence on the width of the opening OP4 formed by etching due to etching in sequence SQ3 can also be reduced and the influence due to the density of the mask MK4 (the density of the mask MK1) can be reduced.

As described above, protection required for the mask MK4 is performed every time sequence SQ3 for removing the atomic layer of the surface of the layer EL to be etched is executed, and by repeating sequence of SQ3, excessive protection can be avoided while protection required for etching the layer EL to be etched is formed on the mask MK4. Since the film thickness of the protective film protecting the mask MK4 is sufficiently reduced, wiggling of the mask MK4 caused by the protective film can be avoided.

In step ST9b, in a case where the gas G5 contains, for example, $CF_4$ and Ar, as the gas flow rate of Ar is larger than the gas flow rate of $CF_4$ and time to supply Ar gas into the processing container 12 is longer than time to supply $CF_4$ gas into the processing container 12, LWR is reduced and the shape maintenance of the mask MK4 is improved. In a case where Ar gas is used as a rare gas used for releasing secondary electrons and silicon in step ST9a, as the time to supply Ar gas to the processing container 12 is increased (execution time of step ST9a), LWR is reduced and the shape maintenance of the mask MK4 is improved.

The principle of the present invention has been illustrated and described above in the preferable embodiments, but it is recognized by a person skilled in the art that the present invention can be modified in arrangements and details without deviating from such a principle. The present invention is not limited to the specific configuration disclosed in the present embodiment. Accordingly, a right to make all amendments and changes that come from the scope of the claim and the scope of spirit is claimed. For example, a series of steps of steps ST2 to ST7 are provided to etch the antireflection film AL, but the antireflection film AL can be etched by a known reactive ion etching (RIE), instead of execution of a series of steps of steps ST2 to ST7 or instead of execution of a series of steps of sequence SQ2 to step ST7. Further, for example, step ST2 of the series of steps of steps ST2 to ST7 may not be executed, and sequence SQ1 to step ST5 may not be executed.

REFERENCE SIGNS LIST

10 . . . PLASMA PROCESSING APPARATUS; 12 . . . PROCESSING CONTAINER; 12e . . . EXHAUST PORT; 12g . . . LOADING/UNLOADING PORT; 14 . . . SUPPORT PORTION; 18a . . . FIRST PLATE; 18b . . . SECOND PLATE; 22 . . . DC POWER SUPPLY; 23 . . . SWITCH; 24 . . . COOLANT FLOW PATH; 26a . . . PIPING; 26b . . . PIPING; 28 . . . GAS SUPPLY LINE; 30 . . . UPPER ELECTRODE; 32 . . . INSULATING SHIELDING MEMBER; 34 . . . ELECTRODE PLATE; 34a . . . GAS DISCHARGE HOLE; 36 . . . ELECTRODE SUPPORT; 36a . . . GAS DIFFUSION CHAMBER; 36b . . . GAS PASSAGE HOLE; 36c . . . GAS INLET; 38 . . . GAS SUPPLY PIPE; 40 . . . GAS SOURCE GROUP; 42 . . . VALVE GROUP; 44 . . . FLOW RATE CONTROLLER GROUP; 46 . . . DEPOSIT SHIELD; 48 . . . EXHAUST PLATE; 50 . . . EXHAUST DEVICE; 52 . . . EXHAUST PIPE; 54 . . . GATE VALVE; 62 . . . FIRST RADIO-FREQUENCY POWER SUPPLY; 64 . . . SECOND RADIO-FREQUENCY POWER SUPPLY; 66 . . . MATCHING UNIT; 68 . . . MATCHING UNIT; 70 . . . POWER SUPPLY; AL . . . ANTIREFLECTION FILM; ALM . . . MASK; Cnt . . . CONTROL UNIT; EL . . . LAYER TO BE ETCHED; ESC . . . ELECTROSTATIC CHUCK; FR . . . FOCUS RING; G1 . . . GAS; HP . . . HEATER POWER SUPPLY; HT . . . HEATER; LE . . . LOWER ELECTRODE; Ly1 . . . LAYER; Ly2 . . . LAYER; MK1 . . . MASK; MK2 . . . MASK; MK3 . . . MASK; MK4 . . . MASK; MS . . . MASK; MX1 . . . MIXED LAYER; MX2 . . . MIXED LAYER; OL . . . ORGANIC FILM; OLM . . . MASK; OP1 . . . OPENING; OP2 . . . OPENING; OP3 . . . OPENING; OP4 . . . OPENING; P1 . . . PLASMA; PD . . . PLACEMENT TABLE; R1 . . . AREA; R2 . . . AREA; R3 . . . AREA; S . . . PROCESSING SPACE; SB . . . SUBSTRATE; SX . . . PROTECTIVE FILM; W . . . WAFER.

The invention claimed is:

1. A method for processing a workpiece, the method comprising:
   providing a workpiece including a layer to be etched and a first mask on the layer to be etched;
   etching the layer to be etched by repeating a first sequence in a processing container without transferring the workpiece out of the processing container, the first sequence including irradiating the first mask with secondary electrons, and covering the first mask with silicon oxide compound containing silicon released from an electrode plate provided in an upper electrode, wherein irradiating and covering the first mask are carried out by generating plasma in a processing container of a plasma processing apparatus in which the workpiece is accommodated and applying a negative DC voltage to the upper electrode of a parallel plate electrode provided in the processing container;

generating plasma of a first gas in the processing container and forming a mixed layer including radicals contained in the plasma on an atomic layer of a surface of the layer to be etched;

purging a space inside the processing container;

generating plasma of a second gas in the processing container and applying a bias voltage to the plasma to remove the mixed layer; and purging a space inside the processing container.

2. The method according to claim 1, wherein
the first gas includes fluorocarbon-based gas and rare gas.

3. The method according to claim 1, wherein
the second gas includes rare gas.

4. The method according to claim 1, wherein the workpiece includes an organic film located on the layer to be etched and an antireflection film located on the organic film, the method further comprising:

forming the first mask, before execution of the first sequence, wherein forming the first mask comprises etching the antireflection film and etching the organic film, by using a second mask located on the antireflection film, wherein the first mask is formed of the antireflection film and the organic film having been etched.

5. The method according to claim 4, further comprising, prior to etching the antireflection film:

conformally forming a protective film on a surface of the second mask in the processing container, and wherein etching the antireflection film comprises removing the antireflection film for each atomic layer with plasma generated in the processing container, using the second mask on which the protective film is formed.

6. The method according to claim 5, further comprising, prior to conformally forming the protective film: irradiating the second mask with secondary electrons by generating plasma in the processing container and applying a negative DC voltage to an upper electrode provided in the processing container.

7. The method according to claim 6, further comprising covering the second mask with the silicon oxide compound containing silicon released from the electrode plate, by generating plasma in the processing container and applying a negative DC voltage to an upper electrode provided in the processing container.

8. The method according to claim 5, wherein
conformally forming the protective film comprises repeating a second sequence including:

supplying a third gas into the processing container, wherein plasma of the third gas is not generated;

purging a space inside the processing container;

generating plasma of a fourth gas in the processing container; and purging a space inside the processing container.

9. The method according to claim 8, wherein
the third gas includes an organic-containing aminosilane-based gas.

10. The method according to claim 9, wherein
the aminosilane-based gas of the third gas includes aminosilane having one to three silicon atoms.

11. The method according to claim 9, wherein
the aminosilane-based gas of the third gas includes aminosilane having one to three amino groups.

12. The method according to claim 8, wherein
the fourth gas includes gas containing oxygen atoms and carbon atoms.

13. The method according to claim 5, wherein
etching the antireflection film comprises repeating a third sequence including:

generating plasma of a fifth gas in the processing container and forming a mixed layer containing radicals contained in the plasma in an atomic layer of a surface of the antireflection film, purging a space inside the processing container;

generating plasma of a sixth gas in the processing container and applying a bias voltage to the plasma to remove the mixed layer; and purging a space inside the processing container.

14. The method according to claim 13, wherein
the fifth gas includes fluorocarbon-based gas and rare gas.

15. The method according to claim 13, wherein
the sixth gas includes rare gas.

16. The method according to claim 4, wherein
the organic film is etched by using a third mask with plasma generated in the processing container, and
the third mask is formed of the second mask and the antireflection film.

17. A method for processing a workpiece in a parallel plate type process chamber including an upper electrode that faces the workpiece, the method comprising:

providing a workpiece including a layer to be etched and a first mask located on the layer to be etched; and performing an atomic layer etching to the layer to be etched by repeating a sequence in a processing container without transferring the workpiece out of the processing container, wherein the sequence includes:

generating plasma from an inert gas and applying a negative DC voltage to the upper electrode to irradiate the first mask with secondary electrons and to cover the first mask with silicon oxide compound;

generating a plasma from a first gas to form a mixed layer including radicals contained in the plasma on a surface of the layer; and generating a plasma from a second gas and applying a bias voltage to the workpiece to remove the mixed layer.

18. The method according to claim 17, wherein the sequence further includes purging a space inside the processing container.

19. A method for processing a workpiece the method comprising:

providing a workpiece including a layer to be etched and a first mask on the layer in a parallel plate type process chamber including an upper electrode that faces the workpiece; and performing an atomic layer etching to the layer by repeating a sequence, wherein
the sequence includes:

(a) generating plasma from an inert gas and applying a negative DC voltage to the upper electrode to irradiate the first mask with secondary electrons and to cover the first mask with silicon oxide compound;

(b) generating a plasma from a first gas to form a mixed layer including radicals contained in the plasma on a surface of the layer; and
(c) generating a plasma from a second gas and applying a bias voltage to the workpiece to remove the mixed layer.

20. The method according to claim 19, wherein (a), (b), and (c) are performed in the processing chamber.

\* \* \* \* \*